United States Patent [19]

Windischmann et al.

[11] Patent Number: 4,579,616
[45] Date of Patent: Apr. 1, 1986

[54] METHOD OF FABRICATION OF AN OPTICALLY FLAT MEMBRANE

[75] Inventors: Henry Windischmann, Huntington; W. D. Buckley, Easton, both of Conn.

[73] Assignee: The Perkin-Elmer Corporation, Norwalk, Conn.

[21] Appl. No.: 551,224

[22] Filed: Nov. 14, 1983

[51] Int. Cl.[4] .......................... B32B 31/00; G03F 9/00
[52] U.S. Cl. .................................... 156/160; 156/163; 156/229; 156/297; 156/267; 378/35; 428/214; 430/5; 430/966; 430/967
[58] Field of Search ...................... 430/4, 5, 966, 967; 378/35; 250/492.1–492.2; 156/108, 160, 163, 297, 299, 330, 267, 229, 292, 295, 84; 428/214; 269/43, 56

[56] References Cited

U.S. PATENT DOCUMENTS

| | | | |
|---|---|---|---|
| 2,934,317 | 4/1960 | Warnken | 156/229 |
| 3,892,973 | 7/1975 | Coquin et al. | 378/35 |
| 4,037,111 | 7/1977 | Coquin et al. | 250/492.2 |
| 4,253,029 | 2/1981 | Lepselter et al. | 378/35 |
| 4,254,174 | 3/1981 | Flanders et al. | 427/259 |
| 4,260,670 | 4/1981 | Burns | 378/35 |
| 4,301,237 | 11/1981 | Burns | 378/35 |
| 4,365,257 | 12/1982 | Gerfast | 346/135.1 |

Primary Examiner—Edward C. Kimlin
Assistant Examiner—Merrell C. Cashion, Jr.
Attorney, Agent, or Firm—Thomas P. Murphy; Richard C. Wilder; Edwin T. Grimes

[57] ABSTRACT

A method for tensioning a thin film on a support ring to achieve an optically flat membrane. The support ring is optically flat with a slight bevel at its outside edge where the membrane is epoxied to the support ring.

7 Claims, 3 Drawing Figures

METHOD OF FABRICATION OF AN OPTICALLY FLAT MEMBRANE

BACKGROUND OF THE INVENTION

Masks used in X-Ray lithography must, of necessity be very thin and flat. The masks must be in the order of 0.5 to 10 microns or less in thickness to transmit the X-Ray beam in sufficient strength to adequately expose the photoresist coating of a wafer. The masks must be optically flat, e.g., ideally to half a wavelength or better to minimize overlay registration error. The present invention provides a method for providing such an optically flat X-Ray mask.

BRIEF SUMMARY OF THE INVENTION

In carrying out the method of the present invention a thin film of material of the type used in X-Ray masks is peripherally supported by a transfer ring. The membrane is then centered onto a support ring whose surface has been polished to a flatness of better than one quarter wavelength. The membrane is epoxied to the outer edge of the support ring which has been slightly beveled. An annular weight is placed on the outer periphery of the transfer ring to place uniform tension on the membrane while the epoxy cures.

DESCRIPTION

Figure 1:
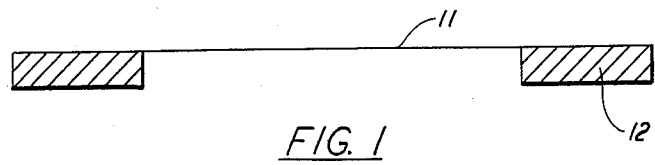
FIG. 1 is a sectional view showing the membrane mounted on the transfer ring.

FIG. 1 shows a thin membrane 11 fixed as by adhesive to a transfer ring 12. One method of providing such a structure is described in an article entitled X-Ray Lithography Mask Technology appearing in the Journal of the Electrochemical Society, Vol. 128, No. 5 May 1981 pps. 1116 to 1120.

The membrane 11 which may be composed of such materials as titanium, SiC, PMMA (poly methyl methacrylate) or polymide is very thin, e.g., membranes of titanium have been produced as thin as 0.4 μm. These membranes which are useful masks in X-Ray lithography are surprisingly rugged and capable of withstanding a high degree of stress and tension. However, the membranes are relatively slack on the transfer ring after removal from the substrate on which they are initially formed.

To be effective for use in X-Ray lithography the masks must be very flat, e.g., not varying by more than half a wavelength, e.g., measured in the visable range over a 12.5 cm diameter. This is necessary to minimize overlay registration errors as a wafer is exposed to an X-Ray source through succeeding masks as circuit patterns are built up on the wafer.

Figure 2:
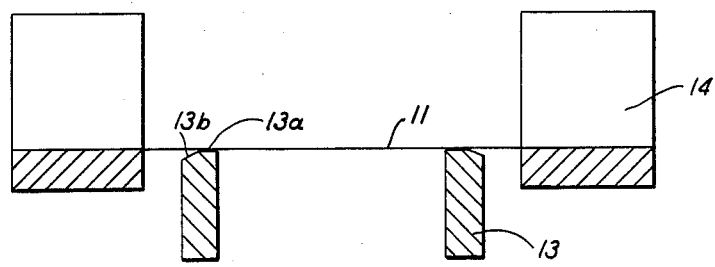
FIG. 2 is a sectional view showing the membrane mounted on the support ring with the weight in place.

In order to provide the required degree of flatness Applicant centers and places the membrane 11 onto support ring 13 as shown in FIG. 2. The inner periphery of the surface 13a of the support ring 13 is polished to a flatness of better than one quarter wavelength. This is critical since the flatness of the surface of the support ring 13 ultimately determines the flatness of the membrane 11. The outer edge of the support ring is slightly beveled at 13b which is exaggerated in FIG. 2 to make it more discernable.

Figure 3:
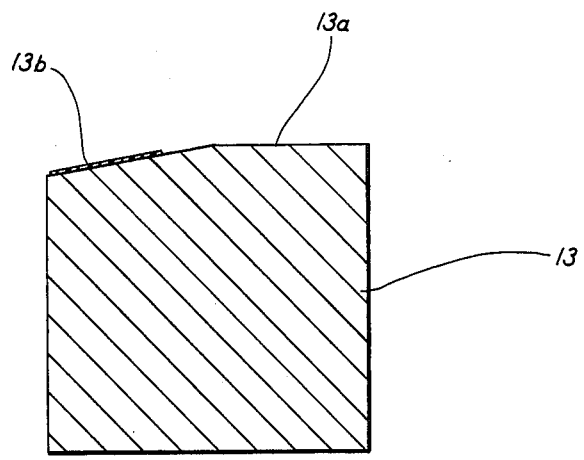
FIG. 3 is an enlarged view of a section of the support ring showing the beveled portion.

FIG. 3 illustrates more clearly the polished surface 13a and the bevel 13b. The beveled surface 13b is coated with a thin layer of epoxy prior to placement of the membrane 11. An annular weight 14 is placed on the outer periphery of the membrane 11 at the position of the transfer ring to place a uniform tension on the membrane 11. The epoxy is then allowed to cure which secures the membrane 11 to the support ring 13 and imparts a flatness to the membrane 11 of better than one half wavelength over its diameter. After the epoxy has been cured, the portion of the membrane 11 extending beyond the outer periphery of the support ring 13 is removed, e.g. by cutting with a razor leaving a drum-like structure with a membrane of optical flatness.

The use of the beveled surface 13b for fixing the membrane 11 to support ring is critical to insure appropriate flatness of the membrane. To fix the membrane directly to the surface of a support ring by applying epoxy thereto degrades the quality of the polished surface which in turn lessens the flatness achievable by the above method. This problem is, of course, eliminated by having the beveled surface 13b to which the epoxy may be applied while the polished surface on which the membrane rests is unaffected. The angle of the bevel relative to surface 13a is very small, e.g., approximately 5°.

Other modifications of the present invention are possible in light of the above description which should not be construed as placing limitations on the present invention other than those expressly set forth in the claims which follow.

What is claimed is:

1. A method for fabricating an optically flat x-ray mask, comprising the steps of:
    forming a thin membrane fixed to a transfer ring;
    forming an annular support ring having an optically flat top and a beveled outer edge extending radially from said optically flat top;
    applying an epoxy to said beveled outer edge only, leaving said optically flat top devoid of epoxy;
    placing said thin membrane fixed to said transfer ring on said optically flat top substantially concentric with said optically flat top;
    applying an annular weight to the outer periphery of said thin membrane around said transfer ring to stretch said thin membrane tautly over said optically flat top and to place said thin membrane adhesively in contact with said epoxy;
    permitting the epoxy to cure thereby securing said thin membrane to said support ring in an optically flat condition;
    removing the excess portion of said thin membrane from around said support ring.

2. A method according to claim 1 wherein, said inner surface is polished to a flatness less than one quarter of a wavelength.

3. A method according to claim 2 wherein, said membrane is tensioned to a flatness of less than one half a wavelength over its diameter.

4. A method according to claim 3 wherein, said membrane is made of titanium.

5. A method according to claim 3 wherein, said membrane is made of SiC.

6. A method according to claim 3 wherein, said membrane is made of polymide.

7. A method according to claim 3 wherein, said membrane is made of poly methyl methacrylate.

* * * * *